(12) United States Patent
Martinez

(10) Patent No.: US 7,275,195 B2
(45) Date of Patent: Sep. 25, 2007

(54) PROGRAMMABLE BUILT-IN SELF-TEST CIRCUIT FOR SERIALIZER/DESERIALIZER CIRCUITS AND METHOD

(75) Inventor: Antonio Marroig Martinez, Los Altos, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 348 days.

(21) Appl. No.: 10/678,511

(22) Filed: Oct. 3, 2003

(65) Prior Publication Data
US 2005/0076280 A1    Apr. 7, 2005

(51) Int. Cl.
*G01R 31/28* (2006.01)

(52) U.S. Cl. .............. 714/733; 714/716; 714/734; 714/739; 714/704; 714/715; 714/738; 714/712; 375/224; 370/249

(58) Field of Classification Search ............... None
See application file for complete search history.

(56) References Cited

U.S. PATENT DOCUMENTS

| | | | | |
|---|---|---|---|---|
| 5,228,042 A | * | 7/1993 | Gauthier et al. ............ 714/716 |
| 5,726,991 A | * | 3/1998 | Chen et al. ................. 714/704 |
| 5,787,114 A | * | 7/1998 | Ramamurthy et al. ...... 375/221 |
| 5,956,370 A | * | 9/1999 | Ducaroir et al. ........... 375/221 |
| 6,028,845 A | * | 2/2000 | Serikawa et al. ........... 370/249 |
| 6,201,829 B1 | * | 3/2001 | Schneider .................. 375/221 |
| 6,693,881 B1 | * | 2/2004 | Huysmans et al. ...... 370/236.1 |
| 6,834,367 B2 | * | 12/2004 | Bonneau et al. ............ 714/738 |
| 6,865,222 B1 | * | 3/2005 | Payne ........................ 375/224 |
| 6,977,960 B2 | * | 12/2005 | Takinosawa ................ 375/224 |
| 2002/0040459 A1 | * | 4/2002 | Watanabe et al. ........... 714/738 |
| 2002/0129311 A1 | * | 9/2002 | Ewen et al. ................. 714/733 |
| 2003/0043752 A1 | * | 3/2003 | Totsuka et al. ............. 370/249 |
| 2003/0149921 A1 | * | 8/2003 | Lau et al. ................... 714/704 |
| 2003/0208707 A9 | * | 11/2003 | Zerbe et al. ................ 714/715 |
| 2004/0030968 A1 | * | 2/2004 | Fan et al. ................... 714/704 |
| 2004/0068683 A1 | * | 4/2004 | Hoang et al. ............... 714/716 |
| 2004/0193985 A1 | * | 9/2004 | Bhora et al. ................ 714/733 |

* cited by examiner

*Primary Examiner*—Guy Lamarre
*Assistant Examiner*—John P Trimmings

(57) ABSTRACT

A built-in self-test circuit for use in testing a serializer/deserializer circuit includes a programmable transmit register that transmits data to the serializer/deserializer circuit having programmably varying characteristics. The built-in self-test circuit includes the transmit register that transmits data to the serializer/deserializer for processing into processed data, a receive register that receives the processed data from the serializer/deserializer, and an error detector that detects errors in the processed data.

17 Claims, 5 Drawing Sheets

PROGRAMMABLE BUILT-IN SELF-TEST CIRCUIT FOR SERIALIZER/DESERIALIZER CIRCUITS AND METHOD

BACKGROUND OF THE INVENTION

Serializer/deserializer (SERDES) circuits are well known in the art. These circuits may also be referred to in the art as internal transmitter/receiver (iTR) circuits.

SERDES circuits are generally incorporated into integrated circuits and operate at ultra high speeds (over 2 Gbps) and convert parallel data to serial data and serial data to parallel data. Modern day SERDES generally are capable of converting 10-bit or 20-bit parallel data into serial data and serial data to 10-bit or 20-bit parallel data.

SERDES circuits sometimes fail in the field. This occurs even though these circuits are tested during their manufacture before being released to the field. High speed imbedded SERDES circuits are generally tested during manufacturing. The tests are usually conducted at operating speed by invoking a built-in self-test (BIST) block with predetermined data patterns. For example, a first data pattern uses a 6-bit shift register. A second data pattern uses a predetermined 80-bit long pattern of mostly alternating 1s and 0s. The resulting character synchronizes the pattern back into 10-bit parallel data that is compared against expected values.

The data patterns discussed above show differences in length and spectral content. The second data pattern is longer than the first data pattern but the spectral content of the second data pattern is limited mostly to 0.5 GHz, with minor peaks at 0.25 GHz, 0.17 GHz, 0.125 GHz, 0.1 GHz, plus other lesser peaks. By comparison, a first pattern has a more complex spectral content, with multiple evenly spread peaks at 0.5 GHz and many other frequencies down to 0.083 GHz. The spectral content of the specific data sequences results in deterministic jitter or even deterministic errors. A longer sequence of 1s or 0s permits the DC level to drift closer to the rails, making it difficult to achieve an opposite level on a subsequent transition. Conversely, rapidly alternating sequences of 1s and 0s may not allow full, robust voltages to develop.

Even with a richer spectral content, specific pattern sequences may not repeat often enough to detect specific failure modes. Hence, specific pattern sequences may not occur often enough to trigger a failure mode that also exhibits a variable time-to-failure dependency due to noise or other factors. These factors will vary for difference circuits because of natural implementation differences, such as location or spatial relation to other circuitry, which in turn generates particular voltage noise sequences, not necessary correlated in time to high speed data patterns.

Hence, the prior art fixed data patterns fail to allow programming of alternate data patterns. Such alternating data patterns would be useful in the field or manufacturing tests since the integrated circuits encounter a wide variation of data patterns in the field. These data patterns encountered in the field can vary from low frequency content patterns to high frequency content patterns and various other content patterns in between. Further, some bit failures are much more difficult to capture, since their likelihood depends on system noise, which is not necessarily correlated in time with the data patterns.

SUMMARY OF THE INVENTION

The present invention provides an improved BIST circuit for use with SERDES circuits. The improved circuit permits varying data patterns to be programmed, even while the integrated circuit associated therewith is in the field. This allows varying and more complicated data patterns to be utilized for testing the SERDES circuits which more closely resemble the data patterns encountered by the SERDES circuits in the field than previously possible.

In accordance with broader aspects of the present invention, the present invention provides a built-in self-test circuit for testing serializer/deserializer circuits that generates test data for use by the serializer/deserializer that has programmably varying characteristics. The varying characteristics may include data sequences and/or data sequence length.

In accordance with one embodiment of the present invention, a built-in self-test circuit includes a transmit register that transmits data to the serializer/deserializer for processing into processed data, a receive register that receives the processed data from the serializer/deserializer, and an error detector that detects errors in the processed data. The transmit register is a programmable transmit register that transmits data having programmably varying characteristics.

The programmably varying characteristics may include data sequence. The programmably varying characteristics may alternatively, or in addition, include data sequence length.

The programmable transmit register may comprise a programmable bit sequence generator that generates the transmitted data. The programmable transmit register, in accordance with one embodiment, comprises a shift register. The programmable transmit register, in accordance with an alternative embodiment, comprises a pseudo random counter. In accordance with a still further embodiment, the programmable transmit register may comprise a register array and a pointer. In accordance with a still further embodiment of the invention, the programmable transmit register may comprise a pseudo random counter and a register array.

The present invention, in accordance with a further embodiment, provides an integrated circuit comprising a serializer/deserializer circuit that processes data and a built-in self-test circuit. The built-in self-test circuit includes a programmable transmit register that transmits data having programmably varying characteristics to the serializer/deserializer.

The programmable transmit register may comprise a programmable bit sequence generator that generates the transmitted data. The programmable transmit register, in accordance with one embodiment, comprises a shift register. The programmable transmit register, in accordance with an alternative embodiment, comprises a pseudo random counter. In accordance with a still further embodiment, the programmable transmit register may comprise a register array and a pointer. In accordance with a still further embodiment of the invention, the programmable transmit register may comprise a pseudo random counter and a register array.

The present invention, in accordance with a further embodiment, provides an integrated circuit comprising a serializer/deserializer circuit that processes data and a built-in self-test circuit. The built-in self-test circuit includes a programmable transmit register that sends data having programmably varying characteristics to the serializer/deserializer circuit for high-speed serial transmission, a receive register that receives the high-speed deserialized data from the serializer/deserializer, and an error detector that detects errors in the processed data.

The present invention still further provides a method for use in an integrated circuit. The method comprises the steps of providing programmably varying data to a serializer/deserializer circuit, processing the transmitted data with the serializer/deserializer circuit to produce high-speed serial data, and testing the received processed data for errors.

BRIEF DESCRIPTION OF THE DRAWINGS

The foregoing aspects and many of the attended advantages of this invention will become more readily appreciated as the same become better understood by reference to the following detailed description, when taken in conjunction with the accompanying drawings, wherein.

DESCRIPTION OF THE INVENTION

The following description is presented to enable a person skilled in the art to make and use the invention. The general principles described herein may be applied to embodiments and applications other than those detailed below without departing from the spirit and scope of the present invention. The present invention is not intended to be limited to the embodiments shown, but is to be accorded the widest scope consistent with the principles and features disclosed or suggested herein.

Figure 1:
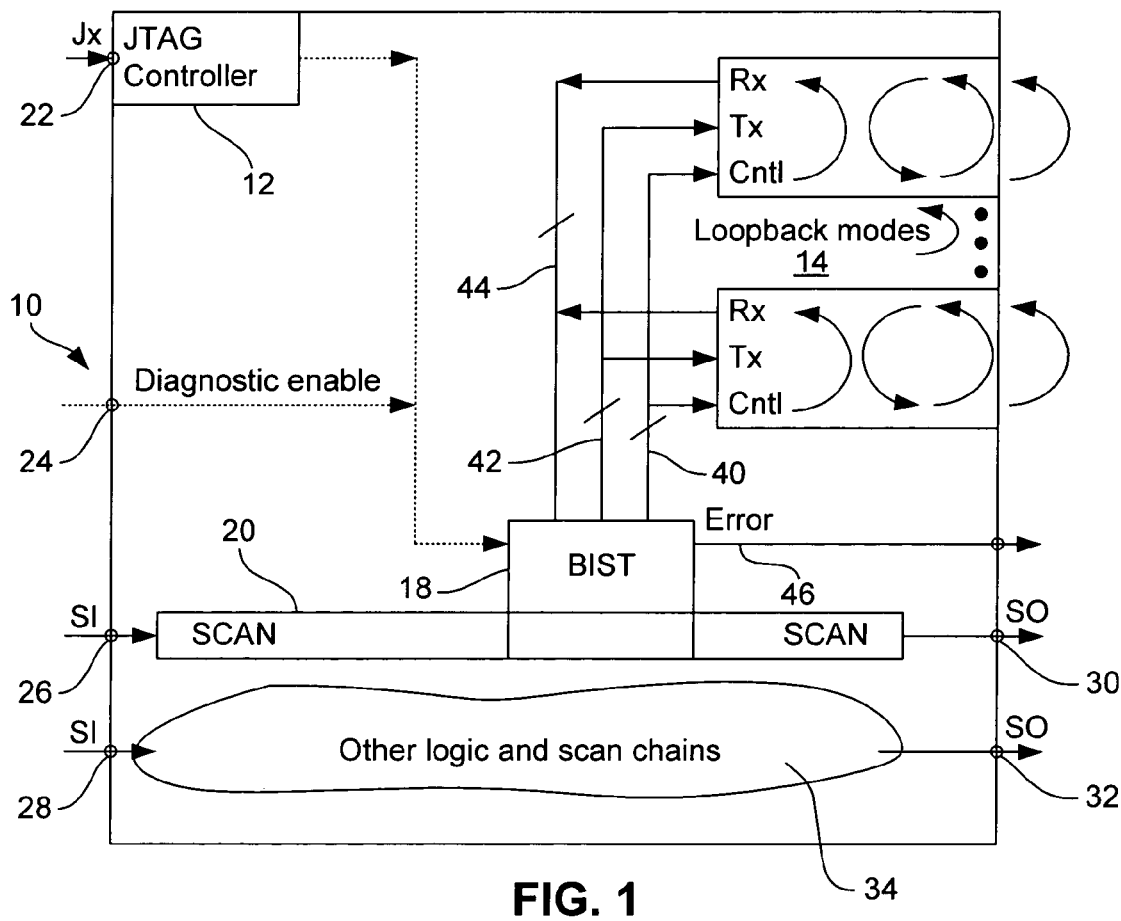
FIG. 1 is a block diagram of an integrated circuit including a BIST circuit embodying the present invention embedded with a SERDES circuit.

FIG. 1 shows an embodiment of an integrated circuit 10 which embodies the present invention. The integrated circuit includes a JTAG controller 12, a plurality of SERDES circuits 14 to be tested in accordance with the present invention, and a built-in self-test (BIST) circuit 18 embodying the present invention and which is imbedded with a scan chain 20. The integrated circuit 10 further includes a Jx external pin 22, a diagnostic enable external pin 24, scan chain input external pins 26 and 28, and scan chain output external pins 30 and 32. In addition to the foregoing, the integrated circuit 10 may include other logic and scan chains as generally represented at 34.

The BIST circuit 18 is coupled to the SERDES circuits 14 by control lines 40, transmit lines 42, and receive lines 44. The BIST circuit 18 generates and transmits programmably varying data patterns to the SERDESs 14 over transmit lines 42 along with control signals 40. The data patterns transmitted to the SERDES circuits 14 is test data conveyed to the SERDESs 14 in parallel. The SERDES circuits 14 are caused, by control signals over control lines 40, to be set in a loop back mode. Loop back modes are well known in the art and are known to include various kinds. Preferably, the BIST circuit 18 invokes a pad or cable loop back mode of the SERDES circuits 14. In the pad loop back mode, a switch is thrown such that an output of the high-speed serial transmitter is connected directly to the input of the high-speed serial receiver. In the cable loop back mode, data loops through an external fixture, such as an external cable, optical loop back hood, or repeater switch.

The data sent by the BIST 18 to the SERDES circuits 14 is converted to a serial format by the SERDES circuits 14, transmitted at high-speed, looped back, received at high-speed, then converted back to a parallel format. The parallel data is then sent back to the BIST circuit 18 over the receive lines 44. As will be seen hereinafter, the BIST compares the transmitted parallel data sent over line 40 to the received parallel data received over line 44. If the transmitted and received data matches, the BIST circuit 18 will have failed to find errors in the SERDES circuits 14. However, if the data received over line 44 is different than the data transmitted over line 42, the BIST circuit 18 will have detected an error. In response thereto, the BIST circuit 18 provides a signal over line 46 indicating that an error has been detected.

The BIST circuit 18 may be enabled in many different ways. A most direct way to enable the BIST circuit 18 is to enable it through external signal pins such as the Jx external pin 22 or the diagnostic enable external pin 24. This would allow diagnostics to be turned on at any time, even while the rest of the integrated circuit is operating. Data patterns may be programmed through internal registers, before the BIST circuit 18 is enabled.

Alternative methods of enabling the BIST circuit 18 may include use of the JTAG controller 12 or the scan chain 20. In both of these cases, data patterns must be loaded through scan, either JTAG or scan chain 20. Use of the internal scan chain would permit a tester to enable and test any number of SERDES circuits with any number of data patterns during manufacturing tests. This would allow quicker modification and enhancement of manufacturing test sequences if field failure data points out weaknesses that are slipping past manufacturing tests. Of course, the appropriate loop back mode must be set during manufacturing test or JTAG invocation, along with appropriate termination.

Figure 2:
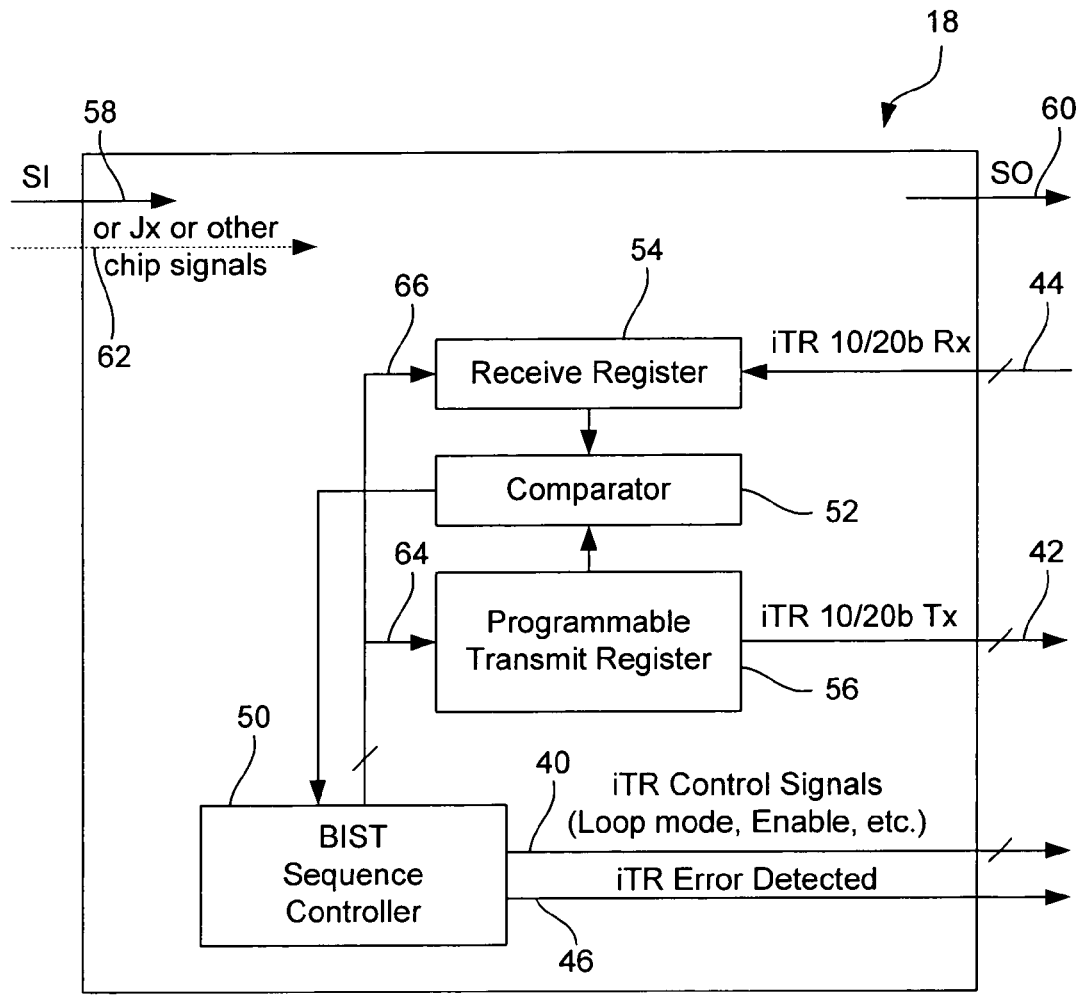
FIG. 2 is a block diagram of the BIST circuit of FIG. 1 representing an embodiment of the present invention.

Referring now to FIG. 2, it illustrates the BIST circuit 18 of FIG. 1. The BIST circuit includes a BIST sequence controller 50, a comparator 52, a receive register 54, and a programmable transmit register 56. Also illustrated in FIG. 2 are scan inputs 58, scan outputs 60, and Jx or other control signals 62.

The BIST sequence controller is coupled to control line 40 for providing control signals to the SE ROES circuits to enable the SERDESs and set the loop mode, for example. The BIST sequence controller also provides the error detection signal over line 46.

The programmable transmit register 56 generates and transmits programmable varying parallel data patterns over the transmit bus 42. The transmit bus 42 may support, for example, 10 or 20 parallel bit data.

The receive register 54 receives processed data from the SERDES circuits over the receive bus 44. Similarly, the receive bus 44 may accommodate 10 or 20 parallel bit data. The transmit register 56 and receive register 54 receive enable and control signals from the BIST sequence controller over control lines 64 and 66.

As previously mentioned, the programmable transmit register generates and transmits programmably varying data patterns to the SERDES circuits. The SERDES circuits process the transmitted data into processed data and returns the processed data to the receive register 54 over the receive bus 44. The comparator 52 then compares the processed data received by the received register 54 to the transmitted data transmitted by the transmit register 56. Should the comparator 52 detect any errors between the processed and transmitted data, the BIST sequence controller 50 will issue an error signal over the error detected line 46.

Figure 3:
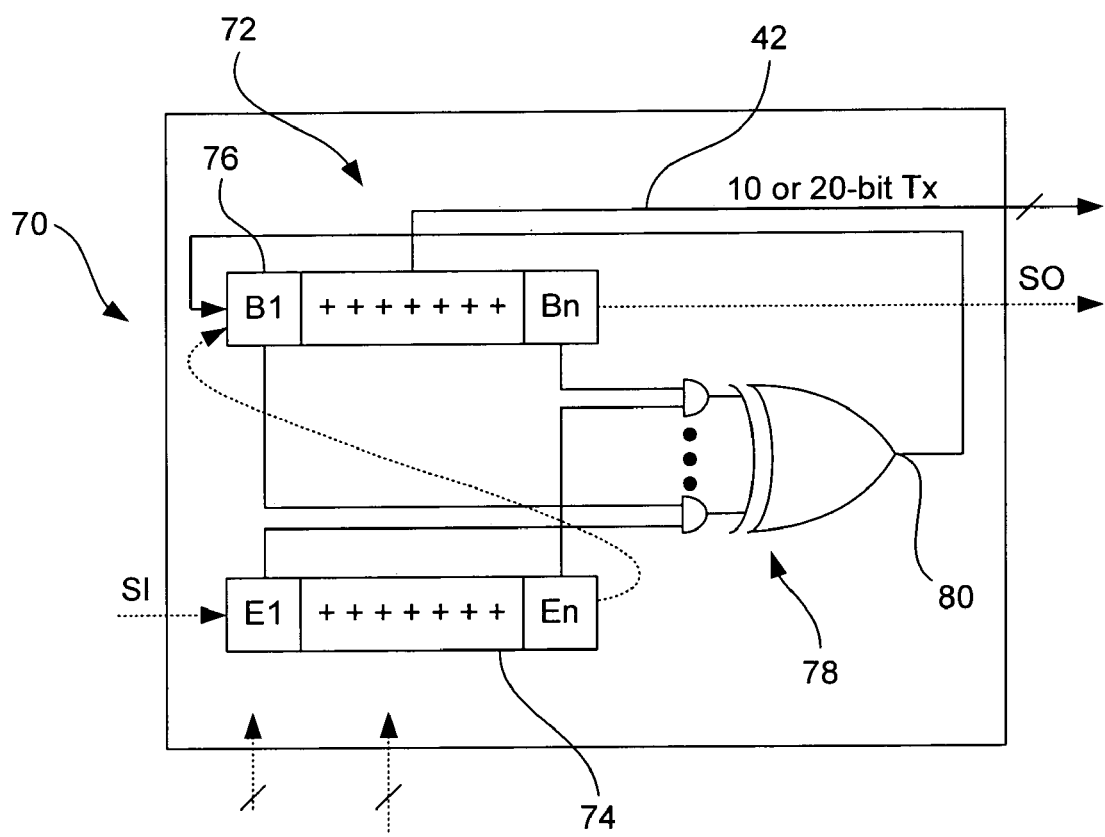
FIG. 3 is a schematic diagram of a first programmable transmit register which may be utilized in the BIST circuit of the present invention in accordance with a first embodiment.

FIG. 3 shows an example of a programmable bit sequence generator 70 which may be used for the programmable transmit register 56 of the BIST circuit of FIG. 2. The programmable bit sequence generator 70 may take the form of a linear feedback shift register (LFSR) 72, also known in the art as a pseudo random counter. Such pseudo random counters are well known in the art. The pseudo random counter 72 of FIG. 3 includes an enable register 74, a bit position register 76, and an exclusive OR gate 78. The pseudo random counter 72 is programmable through the enable bits E1-En to generate different bit sequences. Specific bit positions in the register 76 (any combination of B1-Bn) are gated by bit E1-En then sent to the exclusive OR gate 78. The output 80 of the exclusive OR gate 78 generates a series of digital 1s or 0s, which repeat after a number of cycles, depending on the combination of bit positions. By enabling different bit positions to feed the exclusive OR gate, the pattern sequence and length may be varied. Also, by allowing different seed values to be loaded onto the register 76, a different bit sequence may be achieved. These bit sequences are then transmitted to the SERDES circuits over transmit bus 42.

Figure 4:
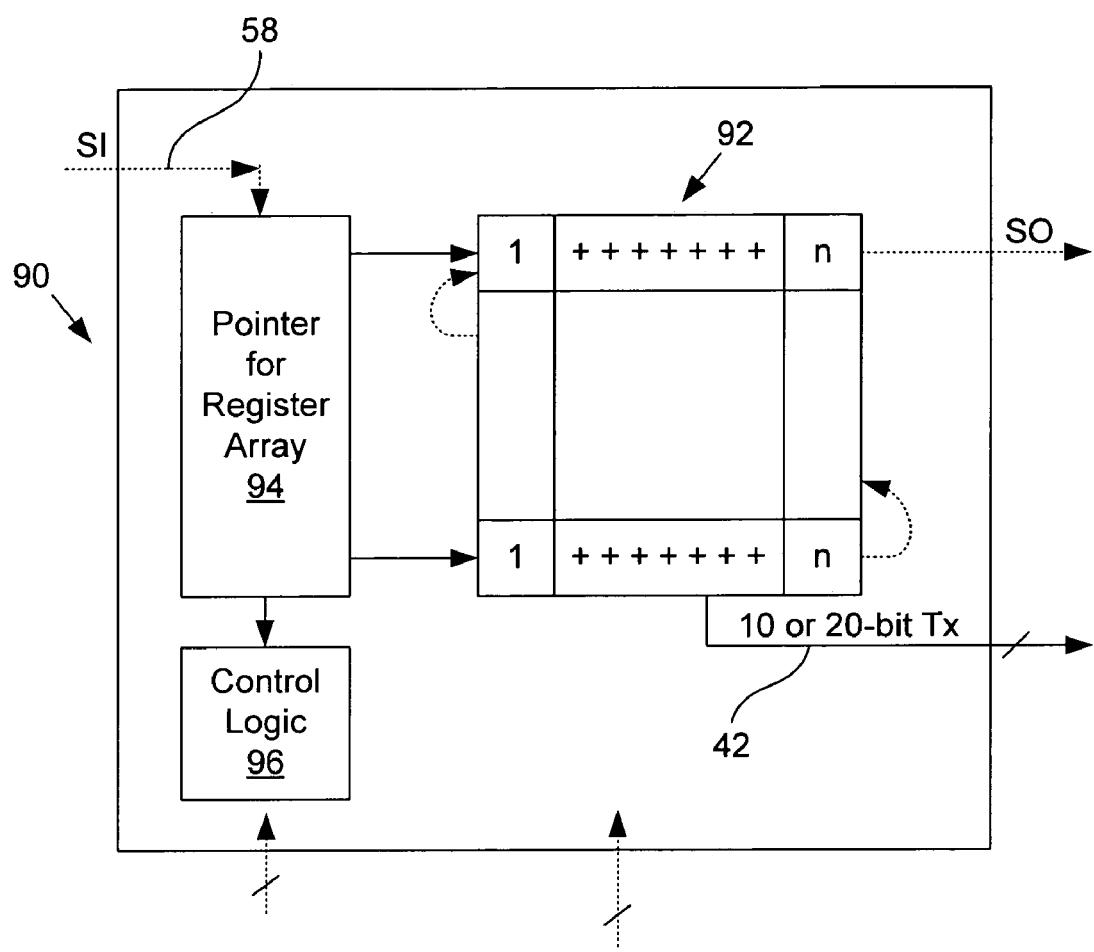
FIG. 4 is a block diagram of another programmable transmit register which may be utilized in the BIST circuit of the present invention in accordance with a second embodiment.

FIG. 4 shows another example of a programmable bit sequence generator 90 which may be utilized for the programmable transmit register 56 of the BIST circuit 18 of FIG. 2. The programmable bit sequence generator 90 generally includes a register array 92, a register array pointer 94, and control logic 96.

The register array 92 is n-bits wide by m-words deep. It may be loaded with various bit sequences. By using the pointer 94 to point to different words in the register array, different data patterns may be sent to the SERDES circuits over the transmission bus 42. It is possible to send any number of combinations of bit sequences in any order simply by changing the pointer to different words in the array. It is also possible to change the pointer position through the scan chain with scan chain input signals by breaking out the scan chain to the pointer and only varying the contents of the pointer so as to send any combination of words. However, it may be faster and more practical to use a parallel interface, bus and control signals from control logic 96 to change the register array pointer and n-bit pattern sent to the SERDES circuits.

Figure 5:
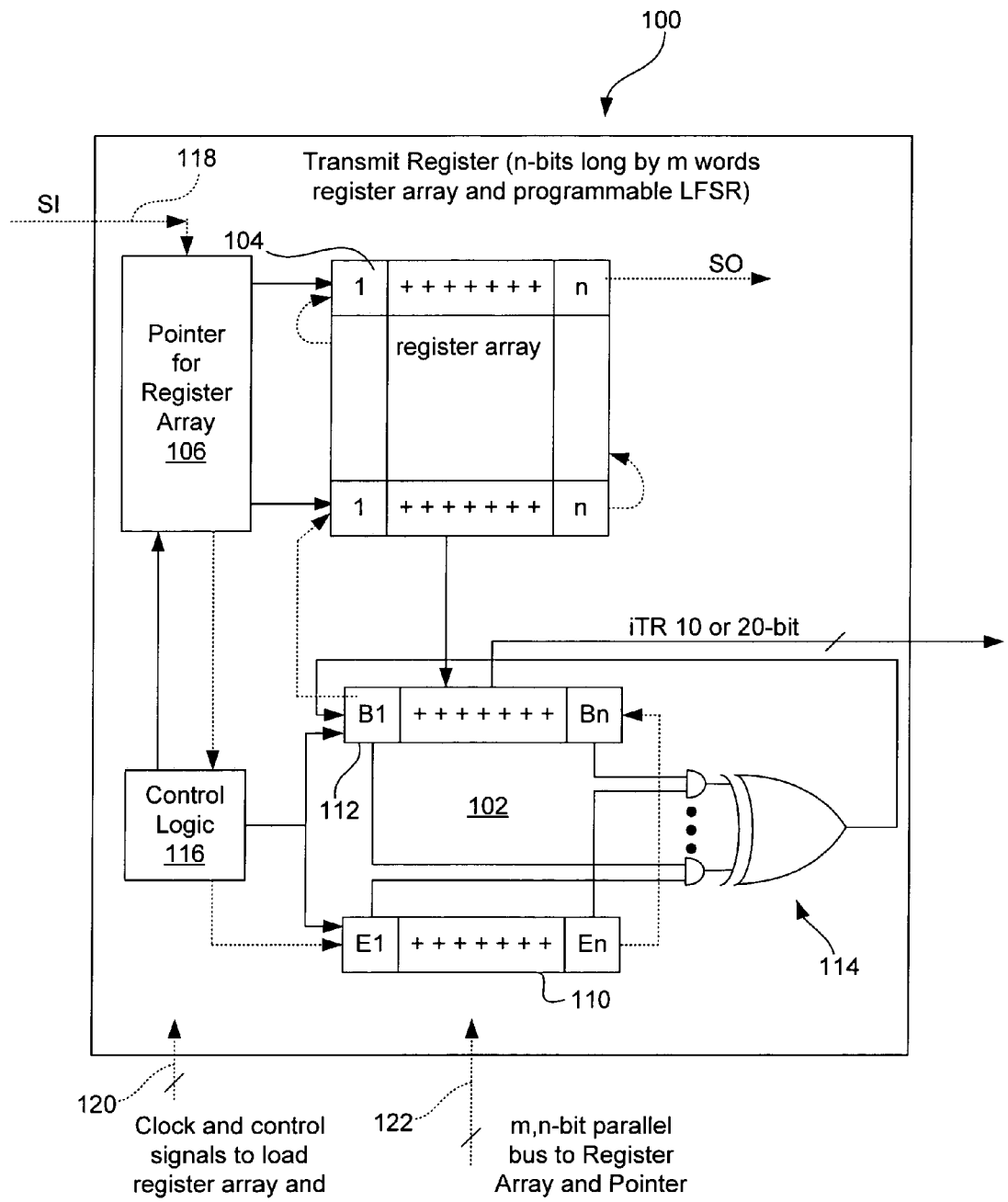
FIG. 5 is a block diagram of a still further transmit register that may be utilized in the BIST circuit of the present invention in accordance with a further embodiment thereof.

FIG. 5 shows a still further programmable bit sequence controller 100 which may be used in the programmable transmit register 56 of the BIST circuit 18 of FIG. 2. Here, the programmable bit sequence generator 100 comprises a combination of a programmable LSFR or pseudo random counter 102 and a register array 104 and pointer 106. The pseudo random counter 102 includes an enable weights register 110, a bit sequence register 112, and an exclusive OR gate 114. The control logic 116 controls the pointer 106, the LFSR 102 and the enable weight register 110. One possible scan chain connection is shown by dashed lines.

Here, the number of possible data patterns increases substantially. Different starting seed values may be loaded into the pseudo random counter 102 and also different enable weights register. The pseudo random counter 102 will generate different length and complexity patterns based on different seed values and enable bit combinations. At the other extreme, the pseudo random counter is not allowed to change the pattern being sent to the SERDES circuits, either by not allowing any shifting to occur from the exclusive OR gate 114 to the input in bit position B1, or by allowing a simple loop back shift operating by only enabling bit Bn to go to the exclusive OR gate.

The various data patterns may be accessed and programmed serially through scan chain inputs 118. Alternatively, this may be accomplished in parallel through internal busses 122 or control signals 120. Either serial scan chain or parallel bus signals requires a clock (not shown) as will be understood by those skilled in the art. In practice, a parallel interface would operate at higher speed than a scan chain interface, and would be more practical for invoking the register array words.

We claim:

1. A built-in self-test circuit for testing a data processing circuit arranged to serialize and deserialize received parallel data into processed parallel data, the built-in self-test circuit comprising:

a transmit register that transmits parallel data to the data processing circuit for processing the parallel data into processed parallel data;

a receive register that receives the processed parallel data from the data processing circuit; and an error detector coupled to the transmit register for receiving the transmitted parallel data from the transmit register and to the receive register for receiving the processed parallel data and that detects errors in the processed parallel data, the transmit register being a programmable transmit register that comprises a register array and that transmits parallel data having programmably varying characteristics by generating a programmable combination of a plurality of bit sequences, each of the bit sequences stored in the register array.

2. The built-in self-test circuit of claim 1 wherein the programmably varying characteristics includes data sequence.

3. The built-in self-test circuit of claim 1 wherein the programmably varying characteristics include data sequence length.

4. The built-in self-test circuit of claim 1 wherein the programmably varying characteristics include data sequence and data length.

5. The built-in self-test circuit of claim 1 wherein the programmable transmit register comprises a programmable bit sequence generator that generates the transmitted data.

6. The built-in self-test circuit of claim 1 wherein the programmable transmit register further comprises a shift register.

7. The built-in self-test circuit of claim 1 wherein the programmable transmit register further comprises a pseudo random counter.

8. The built-in self-test circuit of claim 1 wherein the error detector comprises a comparator.

9. A built-in self-test circuit for testing a data processing circuit arranged to serialize and deserialize received parallel data into processed parallel data comprising:

a programmable transmit register that transmits parallel data having programmably varying data sequences to the data processing circuit for processing the parallel data into processed parallel data, the programmable transmit register comprising a register array and generating a programmable combination of a plurality of bit sequences, each of the bit sequences stored in the register array;

a receive register that receives the processed parallel data from the data processing circuit; and an error detector coupled to the transmit register for receiving the transmitted parallel data from the transmit register and to the receive register for receiving the processed parallel data and that detects errors in the processed parallel data.

10. The built-in self-test circuit of claim 9 wherein the programmably varying data sequences have programmably varying data sequence lengths.

11. The built-in self-test circuit of claim 9 wherein the programmable transmit register comprises a programmable bit sequence generator.

12. The built-in self-test circuit of claim 9 wherein the programmable transmit register further comprises a pseudo random counter.

13. An integrated circuit comprising:
a data processing circuit arranged to serialize and deserialize received parallel data into processed parallel data; and
a built-in self-test circuit that includes,
a programmable transmit register that transmits parallel data having programmably varying characteristics to the data processing circuit for processing parallel data into processed parallel data, the programmable transmit register comprising a register array and generating a programmable combination of a plurality of bit sequences, each of the bit sequences stored in the register array;
a receive register that receives the processed parallel data from the data processing circuit; and
an error detector coupled to the transmit register for receiving the transmitted parallel data from the transmit register and to the receive register for receiving the processed parallel data and that detects errors in the processed data.

14. The integrated circuit of claim 13 wherein the programmable transmit register further comprises a pseudo random counter.

15. In an integrated circuit, a method comprising:
storing a plurality of bit sequences in a register array;
generating programmably varying parallel data by generating a programmable combination of the plurality of bit sequences that are stored in the register array;
transmitting the programmably varying parallel data to a data processing circuit;
causing the data processing circuit to serialize and deserialize the transmitted data to produce processed parallel data; and
testing the processed parallel data for errors by comparing the transmitted data to the processed parallel data.

16. The method of claim 15 wherein the transmitting step includes providing varying data sequences in the data.

17. The method of claim 15 wherein the transmitting step includes providing varying data sequence length of the data.

* * * * *